United States Patent [19]

Liang et al.

[11] Patent Number: 4,767,826
[45] Date of Patent: Aug. 30, 1988

[54] RADIATION-SENSITIVE POLYMERS

[75] Inventors: Rong-Chang Liang, Briarwood, N.Y.; Subhash Narang, Menlo Park, Calif.; Arnost Reiser, Brooklyn, N.Y.

[73] Assignee: Polytechnic Institute of New York, Brooklyn, N.Y.

[21] Appl. No.: 756,354

[22] Filed: Jul. 18, 1985

[51] Int. Cl.$^4$ ............................................. C80F 283/04
[52] U.S. Cl. ..................................... 525/421; 525/455; 525/458; 528/33; 528/75; 528/76
[58] Field of Search ....................... 525/455, 458, 421; 528/75, 76, 33

[56] References Cited

U.S. PATENT DOCUMENTS

| | | | |
|---|---|---|---|
| 2,941,010 | 6/1960 | Mann et al. | 260/615 |
| 3,065,283 | 11/1962 | Happel et al. | 260/678 |
| 3,300,456 | 1/1967 | Hay | 260/88.2 |
| 3,501,297 | 3/1970 | Cremeans | 96/48 |
| 3,501,302 | 3/1970 | Foltz | 96/88 |
| 3,501,303 | 3/1970 | Foltz | 96/88 |
| 3,594,175 | 7/1971 | Hay | 96/115 |
| 3,709,860 | 1/1973 | Fischer et al. | 260/77.5 |
| 3,743,505 | 7/1973 | Bloom et al. | 96/48 |
| 3,844,791 | 10/1974 | Bloom et al. | 96/83 |
| 3,954,816 | 5/1976 | Bloom et al. | 260/404.5 |
| 4,066,676 | 1/1978 | Bloom et al. | 260/402.5 |
| 4,133,723 | 1/1979 | Howard | 528/75 |
| 4,220,747 | 9/1980 | Preziosi et al. | 526/285 |
| 4,312,798 | 1/1982 | Kovacs | 528/75 |
| 4,379,906 | 4/1983 | Chattha | 528/75 |
| 4,396,053 | 8/1983 | Davis et al. | 528/75 |
| 4,399,239 | 8/1983 | Herwig et al. | 528/75 |
| 4,431,263 | 2/1984 | Garito | 350/96.34 |
| 4,439,514 | 3/1984 | Garito | 430/272 |

OTHER PUBLICATIONS

"Substituted Phenylacetyleses. Infrared Spectra", A. D. Allen and C. D. Cook, *Canadian Journal of Chem.*, vol. 41 (1963), pp. 1084–1087.

*Journal of Polymer Science*, Polymer Physics Edition, Aug. 1974, vol. 12, No. 8, "Solid–State Synthesis of Large Polymer Single Crystals", R. H. Baughman.

"The Solid State Synthesis and Properties of Photoconducting, Metallic, and Superconducting Polymer Crystals", Ray H. Baughman, pp. 205–233, 1978.

Polymer Letters, *Journal of Polymer Science*, Part B, vol. 9, No. 2, Feb. 1971, John Woley and Sons, pp. 134–144.

Primary Examiner—Joseph L. Schofer
Assistant Examiner—Bernard Lipman
Attorney, Agent, or Firm—Curtis, Morris & Safford

[57] ABSTRACT

This invention relates to the preparation of solvent soluble polymeric materials which become insoluble in solvents after exposure to actinic light, x-rays or electron beams.

The polymers are linear block copolymers comprising two segments; a soft segment which forms a continuous phase, and a rigid, crystallizable photoreactive segment which forms a dispersed phase. The rigid segments are chosen from polyurethanes, polyesters, polyamides, and polyureas which contain a diacetylene group in their repeat units. The soft segments are low molecular weight rubbery polymers selected from groups such as polyethers, polyesters, polydienes, and polysiloxanes.

The polymers produced are useful in a wide variety of applications in the field of coatings and graphic arts. More particularly, this invention relates to negative photoresists which are remarkable by their (1) high photosensitivity (2) great latitude in tailoring of film properties, (3) high thermal stability and (4) oxygen insensitivity.

10 Claims, No Drawings

RADIATION-SENSITIVE POLYMERS

BACKGROUND OF THE INVENTION

1. Field of Invention

This invention relates to the field of solvent soluble polymers which are photo-sensitive or radiation sensitive and provide solvent insoluble products with utility in making resist imaging materials and other image forming materials.

2. Background Art

Compounds containing conjugated acetylenic bonds in a linear chain are well known in the art. These compounds are variously referred to as polyacetylenic compounds and polyynes. Their preparation is disclosed in U.S. Pat. No. 2,816,149, U.S. Pat. No. 2,941,010, and U.S. Pat No. 3,065,283 and variations are disclosed in later patents.

The fact that polyynes as a class contain many radiation sensitive compounds is also well known in the art (U.S. Pat. No. 3,502,297; U.S. Pat. No. 3,501,301; U.S. Pat. No. 3,501,303; U.S. Pat. No. 3,501,308). These references emphasize the crystalline nature of the materials and the fact that they give colored results on radiation exposure. They also disclose their use in imaging as microcrystals dispersed in a binder.

In addition to radiation sensitive polyynes, some polymers are thermochromic (U.S. Pat. No. 3,723,121; U.S. Pat. No. 4,215,208; U.S. Pat. No. 4,452,995), others are radiation sensitive only under the influence of an electric field (U.S. Pat. No. 3,726,769), and yet others are electrosensitive when coated as a layer on the surface of certain photoconductors (U.S. Pat. No. 3,772,011).

Increased radiation sensitivity is disclosed for certain explicit polyynes e.g. amine salts of carboxylated polyynes in U.S. Pat. No. 3,743,505 and its divisional cases U.S. Pat. No. 3,844,791, U.S. Pat. No. 3,954,816 and U.S. Pat. No. 4,066,676. Most radiation sensitive polyynes respond primarly to UV rays and to electron beams.

The radiation sensitivity of many polyynes may be enhanced and extended to wavelengths other than those of their fundamental sensitivity by the addition of spectral sensitizing compounds to the sensitive composition. Thus sensitivity to visible light is conferred by inorganic metallic salts (U.S. Pat. No. 3,772,027; U.S. Pat. No. 3,822,134) and by pyrylium, thiapyrylium, and selenopyrylium salts (U.S. Pat. No. 3,772,028). Sensitivity to X-rays is conferred by organometallic compounds such as triphenylbismuthine and hexaphenyldilead (U.S. Pat. No. 3,811,895).

Enhancement of the primary produced image (by radiation or heat) can be accomplished by subsequent uniform illumination to wavelengths absorbed by the colored imaged (U.S. Pat. No. 3,794,491) or by subsequent heating (U.S. Pat. No. 3,501,302).

The mechanism by which polyynes (that is, inclusive of diynes upward) produce colored results under the action of radiation or heat has also been studied in the literature. (Contemporary Topics in Polymer Science Vol. 2 Pages 190-194 Edited by E. M. Pearce and J. R. Schaefgen, Plenum Press New York & London 1977; G. Wegner, Pure & Appl. Chem. 49 443-454 (1977)). This work has shown that the effect is a radiation induced polymerization in which the α-carbons of the end acetylene groups of the polyyne react by addition to form a fully conjugated linear chain. The reaction is reported to occur only in the solid state. The making of such polymers in liquid phases rather than in the solid phase is claimed in several patents (U.S. Pat. No. 4,220,747; CA Pat. No. 1,043,945) and the change in solubility from polyyne to polymerized polyyne is noted. This change in solubility is applied to photoresist systems for printing plates and high resolution electronic circuit making in U.S. Pat. No. 3,836,709 and U.S. Pat. No. 4,439,514.

Use of the polyyne polymers per se is disclosed for reversible thermochromic imaging (U.S. Pat. No. 4,215,208; U.S. Pat. No. 4,452,9959) and for non-linear optical materials (U.S. Pat. No. 4,431,268).

To summarize the art described so far, the polyyne chains are disclosed as radiation sensitive in the solid state to give colored polymers by addition reaction of the end acetylene groups. These polymers may be relatively insoluble compared with the polyynes, and may show thermochromic, or non-linear optical properties. None of the disclosures indicates that these polymerized polyynes remain radiation sensitive in the more direct sense except to the extent that feeble images may be amplified by further non-imagewise illumination.

In many of the above disclosures it is emphasized that not only is the polyyne itself crystalline but the resulting colored polymer is also crystalline and of high strength, or at least has two-dimensional periodicity as in nematic liquid crystals (U.S. Pat. No. 4,220,747; U.S. Pat. No. 4,431,263). Furthermore in U.S. Pat. No. 4,439,514 it is disclosed that when a crystalline array of diynes is very regular, polymerization across a pair of adjacent acetylene bonds by one absorbed photon initiates progressive polymerization along a line of adjacent diyne molecules. Thus high quantum efficiencies are found in such systems, with values between $10^8$ and $10^{12}$ molecules reacted per absorbed photon. This same patent discloses that to maintain high quality imaging properties under these conditions, heat treatement of the coated layer of diynes is used to create micro-crystalline domains, the boundries between which obstruct polymerization across them. The polymerized forms are not only colored but are not easily soluble in solvents.

Copolymers of diynes with other organic comonomers are known in the art, in which the acetylene bonds are not used in the polymerization. Thus A. S. Hay in U.S. Pat. No. 3,300,456, U.S. Pat. No. 3,594,175 and J. Polym. Sci. A-1, 8.1022 (1970) describes polymers of the form

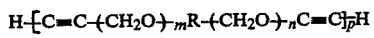

wherein m and n are independently 0 or 1, p is at least 10 and R is an arylene or alkylene radical or a combination of these radicals, or a combination of two arylene or alkylene radicals with a intermediate carbonyl, or sulfone group. Certain of these copolymers are soluble in solvents and can be coated as layers on a substrate. Their initial amorphous form can be changed to crystalline by washing with certain solvents. In the later patent these polymers are described as being capable of crosslinking under the influence of radiation, but this is accomplished only with some difficulty. Inclusion of sensitizing compounds such as rose bengal, tetraiodofluorescein, hemoporphyrin, and p-diethynylbenzene can give crosslinking with much less radiation. The crosslinked forms are not easily soluble in solvents and the polymers may therefore be used as photoresists.

Further copolymers of diynes with other comonomers such as urethane, ester, amide, and urea groups are disclosed by Fischer & Wegner in U.S. Pat. No. 3,709,860 and by G. Wegner in Makrom. Chem. 134, 219 (1970). These polymers contain diyne units

interspersed with hydrocarbon, polyether and urethane etc. units. Suitable polymers contain at least 20% by weight of the diyne units above and contain groups capable of forming secondary valence bonds and contain crystalline fractions. The polymers are soluble in solvents but on exposure to radiation become colored and insoluble, thus being suitable for photoresist imaging systems. Examples indicate exposures required are 5–20 minutes to a powerful ultraviolet lamp. It is indicated that non-diyne units as well as the diyne units respond to the radiation. Photosensitizers known in the art may be used.

Patil et al in J. Polym. Sci., Polym. Chem. Ed. 19.115 (1981) discloses the preparation and properties of a series of aliphatic and aromatic polyesters containing a diacetylene unit in the backbone of their repeating unit.

Hanson in U.S. Pat. No. 4,439,590 discloses polymers of the form

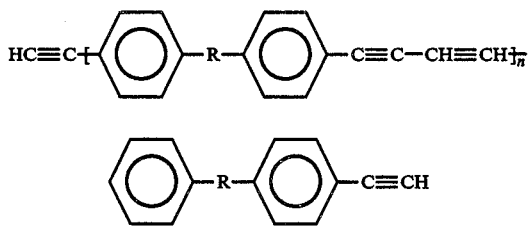

wherein R is a strong electron withdrawing group like

or —CO—. These polymers are not disclosed as radiation sensitive and do not contain the conjugated diacetylenes.

Thus, early workers on the polymerization of diacetylene monomers found that diacetylenes in the crystalline state polymerize efficiently on exposure to light or heat. Wegner, Hay and Patil have incorporated the diacetylene functionality into polymers such as polyesters, polyurethanes and polyphenyl ethers. These polymers in general have a large number of repeat units in the crystalline segment. Crosslinks in the crystalline segments of these polymers connect the same chains and will therefore be effectively redundant, thereby leading to lower photographic efficiency. It is an aspect of this invention to improve the photosensitivity of the diacetylene functionality by increasing the degree of crystallinity while keeping the number of repeat units in the crystalline segments to a minimum.

SUMMARY OF THE INVENTION

This invention relates to polymeric materials useful in imaging application, particularly photoresist imaging applications, in which the initial polymer is solvent soluble and film forming, but on exposure to radiation becomes solvent insoluble.

The materials of the present invention are copolymers, one of the comonomers for which contains a conjugated diacetylene (diyne) unit in its backbone. Copolymerization does not involve the acetylene bonds. Irradiation of the coated layer of polymer produces crosslinking between the acetylene bonds in adjacent polymer chains. The degree of crosslinking is controlled and the quantum efficiency is maintained, by increasing the crystallinity of the diacetylene units while keeping the number of repeat units in the crystalline segment to a minimum. Photosensitivity is thus substantially improved.

The polymers of the present invention are essentially linear block copolymers. They consist of at least two phases. One of these is a crystalline phase termed the rigid or hard segment. The other phase is usually amorphous and is termed the soft segment. The hard segment is essentially formed by the photosensitive diacetylene containing segments of the block copoymers. The soft phase is essentially constituted by low molecular weight rubbery oligomers or prepolymers.

The rigid segments are preferably prepolymers or oligomers of polyurethanes or polyesters derived from diacetylene diols, or are polyamides or polyureas derived from diacetylene diamines.

The soft segments are low molecular weight rubbery polymers terminated with free hydrogen groups such as hydroxyl, amino, or carboxylic acid groups through which the soft segments are able to link with the rigid segments. Examples of soft segments are: polyethers, polyesters, polybutadienes, and polysiloxanes. Other soft segments are also useful and are not excluded.

DETAILED DESCRIPTION OF THE INVENTION

The linear block copolymers of the invention comprise at least two segments; a soft segment which forms a continuous phase, and a rigid, crystallizable and photoreactive segment which forms a dispersed phase.

The rigid prepolymer segments preferably are chosen from polyurethanes, polyesters, polyamides, and polyureas which contain in their repeat units a diacetylene group —C≡C—C≡C—. The rigid block segments are selected from the group A.

A. Rigid Segments

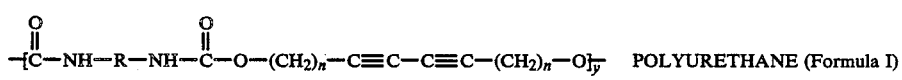  POLYURETHANE (Formula 1)

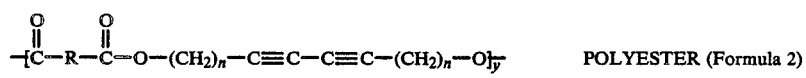  POLYESTER (Formula 2)

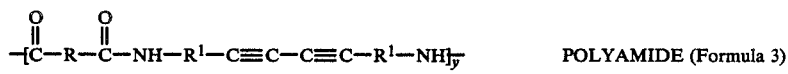  POLYAMIDE (Formula 3)

$$-[\overset{O}{\underset{\|}{C}}-NH-R-NH-\overset{O}{\underset{\|}{C}}-NH-R^1-C\equiv C-C\equiv C-R^1-NH]_y-\quad \text{POLYUREA (Formula 4)}$$

wherein
R, $R^1$ may be the same or different and are chosen from aliphatic, cycloaliphatic, and aromatic divalent groups containing from 2 to 20 carbon atoms,
n is an integer in the range of 1 to 10, and
y is an integer in the range of 1 to 50.

The soft segments are low molecular weight, rubbery polymers terminated with free hydrogen containing groups such as hydroxyl, amino, or carboxylic acid groups through which they are able to link with the rigid segments. The soft segments are preferably selected from the group of rubbery low molecular weight prepolymers and oligomers comprising polyethers, polyester, polydienes, and polysiloxanes.

The soft segments are soft rubbery prepolymer segments preferably selected from the group consisting of polyethers, polyesters, polybutadienes and polysiloxanes. These soft segments must of course be reactable with the rigid segments to form the block copolymer.

B. Soft Segments $$-[R-O]_z-\quad \text{POLYETHER (Formula 5)}$$

$$-[\overset{O}{\underset{\|}{C}}-R-\overset{O}{\underset{\|}{C}}-O-R^1-O]_z-\quad \text{POLYESTER (Formula 6)}$$

$$-[CH_2-\underset{\underset{R^2}{|}}{C}=CH-CH_2]_z-\quad \text{POLYDIENE (Formula 7)}$$

$$-[\underset{\underset{R^4}{|}}{\overset{\overset{R^3}{|}}{Si}}-O]_z-\quad \text{POLYSILOXANE (Formula 8)}$$

wherein
R, $R^1$ are as defined above,
$R^2$ is H, or lower alkyl ($C_1$-$C_6$)
$R^3$, $R^4$ are lower alkyl ($C_1$-$C_4$) and
Z is an integer in the range of 2 to 100.

The molecular weight of the soft segments may range from 300 to 10,000 and is preferably between 500 and 3,000.

The block copolymers can be of a the statistical type $(AB)_x$, or the triblock type (BAB), or (ABA) where A is the rigid segment derived from diacetylene diols or diacetylene diamines and B is the soft segment. The $(AB)_x$ and (ABA) types are preferred because of their better film forming properties. The value of the integer x is in the range 1 to 100.

In each category of rigid segments, there is a variety of molecular structure available which produce a wide range of physical characteristics in the final block copolymers. This enables tailoring photopolymers to many specific requirements.

A general procedure for the preparation of these block copolymers is as follows. A molar excess of, for example, a diisocyanate or diacylchloride is added to a polyetherdiol, a polyesterdiol, a polydienediol, or a polysiloxanediol in a suitable solvent. Soft segment blocks of the block copolymer are formed in this first stage reaction. To the resulting mixture a diacetylene diol or a diacetylene diamine is added in molar equivalence or slightly less, to the excess of diisocyanate or diacylchloride used. The resulting further reaction produces the hard segment blocks joined in a random block copolymer with the soft seqment blocks.

The R in Formulas 1-4 could be aliphatic or aromatic. Aliphatic groups such as $(CH_2)_r$ (r=2 to 8) are preferred because of the higher photosensitivity provided to the copolymers. However, the aromatic substituents have the advantage of higher elastic modulus and higher heat distortion temperature. They are expected to be particularly useful in applications with x-ray and electron irradiation where optical filter effects (non productive absorption of light by these groups) are not important.

All the block copolymers disclosed here were found to be sensitive not only to actinic light but also to X-rays in the energy range 20 KV to 100 KV and to electron beams of energies in the range 10 KeV to 200 KeV.

The ratio of hard to soft segments may range between 2:98 and 90:10 (by weight), and lies preferably between 10:90 and 60:40. More accurately, the average number of repeat units ($\bar{y}$) in the rigid segment of a $(AB)_x$ type block copolymer may range from 1 to 50 and is preferably in the range from 2 to 20. For example Formula 9 illustrates a unit of a polyether-polyurethane block copolymer which contains a diacetylene diol as chain extender. The polyether in this case is a polyoxytetramethylene glycol (PTMG).

$$-O+CH_2CH_2CH_2CH_2-O)_{\overline{m}}\overset{O}{\underset{\|}{C}}-NH-R-NH-\overset{O}{\underset{\|}{C}}\left[O(CH_2)_n-C\equiv C-C\equiv C-(CH_2)_n-O-\overset{O}{\underset{\|}{C}}-NH-R-NH-\overset{O}{\underset{\|}{C}}\right]_y \quad \text{Formula 9}$$

soft segment — chain extender — rigid segment

The average number of repeat units (y) in the rigid segment may be calculated from the following equation:

$$y = \frac{1}{1-p}$$

where p is the transition probability of a segment A joined to another segment A, which in this case may be equated to where p the mole fraction of the hard segment in the block copolymer. Some examples of these block copolymers are listed in Tables 1-4. This equation is based on work reported by H. K. Frensdorff, "Macromolecules", 4. 369 (1971).

The photosensitivity increases with increasing rigid segment content, and levels off at a certain value of y.

The film rigidity also increases with increasing rigid segment content. The film changes from flexible to tough and finally to brittle when more and more rigid segments are introduced into the block copolymer.

The increase in the degree of crystallinity of the block copolymer with increasing rigid segment content, leads in turn to a change from a transparent to a translucent material. However, the transparency of films with a high rigid segment content may be improved in several ways by: (a) reducing the size of the crystallites through the introduction of a small amount of an external nucleation agent (such as sodium benzoate or finely sized particles of silica gel) and/or (b) by increasing the transcrystalline morphology of the films by reducing the film thickness and/or (c) by using cold orientation processes and/or (d) by selection of suitable solvent systems for casting.

The photosensitivity of the block copolymers derives in-part from the degree of phase separation and from the degree of order produced in the rigid phase. For the solid-state photoreaction to occur, the diacetylene units must have an appropriate geometry. This geometry is of very small dimensions within the polymer composition and is imposed by the presence of the soft segments in the copolymer. It has been found, for example, that in some cases where the homopolymer of the diacetylene segments was reported to not be photosensitive (G. Wegner, Makrom. Chem. 134, 219 (1970)), the block copolymers including the same structural diacetylene unit as the rigid segment had a reasonable photosensitivity. Examples of this are TPU-MDI-20-2000 in Table 1 and the structures shown below.

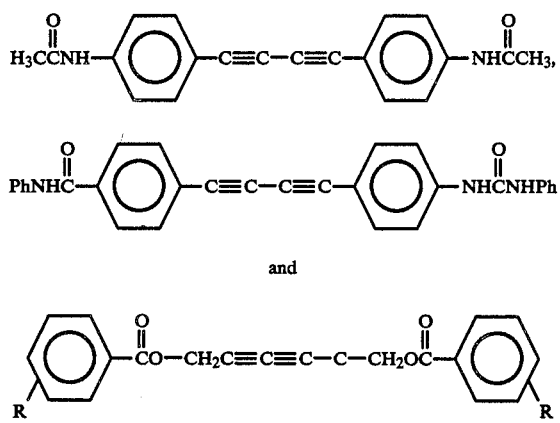

where R is H, or 4-methoxy, or 4-nitro, or 3,5-dinitro, the crystalline monomers are not photosensitive, but polyamide-, polyurea- and polyester-block copolymers based on the above structural units are photosensitive (Tables 2–4).

Both the degree of phase separation and the degree of order in the rigid phase of the block copolymer depend to a large extent on the thermal history of the polymer and considerable improvement in photosensitivity can often be achieved by a suitable thermal treatment. Annealing of the coating after drying can thus improve photosensitivity modestly.

For example, a two- to three-fold increase in photosensitivity has been observed in a PTMG-hexamethylene diisocyanate (HDI)-HD block copolymer with a hard-to-soft ratio of 20:80 (TDU-MDI-20 in Table 1), after annealing for 2–5 minutes at 80° C. (About 60° C. below the melting temperature, $T_m$). A remarkable growth of the melting peak as well as a slightly upward shift of $T_m$ were observed in the Differential Scanning Calorimeter (DSC) thermogram of the annealed sample. This indicates an increase in the degree of crystallinity as well as a decrease in the number of imperfections in the crystalline phase after the thermal treatment. No evidence for thermal polymerization during the annealing period was observed. Improvements in photosensitivity after thermal treatment were observed in many other systems.

The block copolymers of the invention can be spectrally sensitized to light in the visible region by the addition of sensitizers known in the art. (e.g. those disclosed by Hay in U.S. Pat. No. 3,594,175 Col. 2 lines 51 ff). Sensitization to X-rays in the medical range may be accomplished by the addition of compounds disclosed by Ehrlich in U.S. Pat. No. 3,811,895.

The polymers produced are useful in a wide variety of applications in the field of coatings and graphic arts. More particularly, this invention relates to negative photoresists which are remarkable by their (1) high photosensitivity or photographic speed in the solid state, (2) great latitude in tailor-making the film properties, such as toughness, abrasion resistance and adhesion etc for various applications, (3) high thermal stability in either solution or in the solid state under dark conditions, and (4) oxygen insensitivity.

In order to better describe and further clarify this invention, the following non-restrictive examples are given:

EXAMPLE 1

Polyether-Polyurethane Block Copolymer 5 grams of a polyoxytetramethyleneglycol (m.w.=2,000) (hereinafter PTMG) were dissolved in about 100 cc of tetrahydrofuran (THF). 0.137 grams of dibutyltin dilaurate and 1.29 grams of hexamethylene diisocyanate (HDI) were added into the PTMG solution at room temperature and the reaction mixture was then kept for an hour. About 20 cc of a THF solution containing 0.536 grams of 2,4-hexadiyn-1,6-diol was added over a period of 10 minutes into the above reaction mixture under dark conditions and the reaction was allowed to proceed for 3 more hours at room temperature. Then 2 cc of anhydrous ethyl alcohol were added to the reaction mixture, and this was stirred for a further 30 minutes.

Photosensitive films were cast directly from the reaction mixture which was a solution of the polyetherpolyurethane block copolymer.

Optionally, the reaction mixture was poured drop by drop with vigorous stirring into about 800 cc of distilled water. After filtration, washing and subsequent drying in vacuo, about 6.5 grams of a pale yellow precipitate were obtained (Yield: 95.2%). The precipitate was redissolved in THF and the photo-sensitive film was prepared by casting the above solution onto a glass plate.

With a low pressure mercury lamp the exposure time for these films was between 2 to 5 seconds. The exposed areas had then become insoluble in a standard developer which is 75% (vol) dimethyl formamide and 25% (vol) ethyl alcohol (95%) (hereinafter "the standard developer"). (The polymer is referred to as TPU-HDI-20 in Table 1).

The other polymers in Table 1 were prepared and tested in a similar manner.

TABLE 1
Thermoplastic Polyurethanes $$-O-S-O-\overset{O}{\underset{\|}{C}}NHRNH\overset{O}{\underset{\|}{C}}-\left[-OCH_2-C\equiv C-C\equiv CCH_2O\overset{O}{\underset{\|}{C}}NHRNH\overset{O}{\underset{\|}{C}}-\right]_y$$

soft segment — hard segment

| Polymer | R | S | y calc | hard/soft[k] | Solvent | Properties |
|---|---|---|---|---|---|---|
| TPU-HDI-100 | (CH$_2$)$_6$ | — | — | — | THF/DMF | brittle[e], 3–4[a] |
| TPU-HDI-50 | (CH$_2$)$_6$ | PTMG 2000[c] | 8.80 | 5/5 | THF | tough[f], 5 |
| TPU-HDI-20 | (CH$_2$)$_6$ | PTMG 2000 | 2.95 | 2/8 | THF | tough[f], 4 |
| TPU-HDI-10 | (CH$_2$)$_6$ | PTMG 2000 | 1.87 | 1/9 | THF | tough[g], 3 |
| TPU-HDI-05 | (CH$_2$)$_6$ | PTMG 2000 | 1.41 | 0.5/9.5 | THF | flexible[g], 2 |
| TPU-HDI-35 | (CH$_2$)$_6$ | PTMG 650 | 2.59 | 3.5/6.5 | THF | tough[f], 5 |
| TPU-HDI-35 | (CH$_2$)$_6$ | PTMG 1000 | 3.26 | 3.5/6.5 | THF | tough[h], 5 |
| TPU-HDI-35 | (CH$_2$)$_6$ | PTMG 1000 | 5.20 | 3.5/6.5 | THF | tough[f], 5 |
| TPU-HDI-PBD-35 | (CH$_2$)$_6$ | PBD[i] 1350 | 3.94 | 3.5/6.5 | THF | tough[g], 5 |
| TPU-HDI-SiEO-35 | (CH$_2$)$_6$ | SiEO[j] 2400 | 5.71 | 3.5/6.5 | THF | tough[f], 5 |
| TPU-CHDI-20 | —⟨H⟩— | PTMG 2000 | 2.96 | 2/8 | THF | tough[f,h], 4 |
| TPU-CHDI-PBD-35 | —⟨H⟩— | PED 1350 | 2.96 | 3.5/6.5 | THF | tough[g,h], 5 |
| TPU-MPDI-20 | —⟨ ⟩— (meta) | PTMG 2000 | 3.0 | 2/8 | THF/DMF | rigid[f], 0–1 |
| TPU-PPDI-20 | —⟨ ⟩— (para) | PTMG 2000 | 3.0 | 2/8 | THF/dioxane | rigid[f], 0–2 |
| TPU-MDI-20[d] | —⟨ ⟩—CH$_2$—⟨ ⟩— | PTMG 2000 | 2.31 | 2/8 | THF/dioxane | tough[f], 0–2 |
| TPU-TDI-20 | CH$_3$-⟨ ⟩- + CH$_3$-⟨ ⟩- (80:20) | PTMG 2000 | 2.91 | 2/8 | THF | tough[f], 0–2 |

[a] the exposure time required to make an insoluble image (5 = less than 1 second; 4 = 1–2 seconds; 3 = 5–10 seconds; 2 = about 1 minute; 1 = about 5 minutes; 0 = longer than 10 minutes).
[b] Wegner's polymer
[c] Molecular weight of the soft segment, 2000
[d] homopolymer was reported to be non-photosensitive
[e] poor film forming properties
[f] translucent
[g] transparent
[h] high heat distortion
[i] PBD = Polybutadiene
[j] SiEO = Ethylene oxide-dimethylsiloxane block copolymer
[k] wt/wt.

EXAMPLE 2
Polyether-Polyester Block Copolymer

Two grams of PTMG (m.w.=2,000) were dissolved in about 50 cc of THF. 2.174 grams of terephthaloyl chloride were added into the PTMG solution and the reaction mixture was then kept for 2 hours at refluxing temperature. After cooling to room temperature the above mixture was added drop by drop in dark conditions over a period of 30 minutes into a solution containing about 100 cc of THF, 3 cc of pyridine and 1.068 grams of 2,4-hexadiyn-1,6-diol (HD). The reaction was allowed to proceed at room temperature for 5 more hours. Then 2 cc. of anhydrous ethyl alcohol were added to the reaction mixture and this was stirred a further 30 minutes.

After the white pyridinium salt was filtered off, the viscous solution was added drop by drop into 800 cc of distilled water with vigorous stirring. About 4 grams of a yellowish precipitate were obtained after filtration, and successive washing with dilute HCl solution, with distilled water, with dilute NaHCO₃ solution and finally with large amounts of distilled water. The precipitate was dried in vacuo. (Yield: 89.2%).

The block copolymer was redissolved in THF, and a photosensitive film was obtained by casting the solution onto a glass plate. With a low pressure mercury lamp, the exposure time was from 2 to 5 minutes. The exposed areas became insoluble in the standard developer, while the unexposed areas were easily removed with this solvent (TPE-TERE-50 in Table 2).

The remaining polymers in Table 2 were prepared and tested in a similar manner.

temperature. About 30 cc. of a THF solution containing 0.314 grams of 4,4,'-bisaminophenyl butadiyne (prepared from p-nitrocinnamic acid by a 5-step synthesis) were then added over a period of 10 minutes under dark conditions, and the reaction was allowed to continue for 3 more hours at room temperature. After adding 2 cc of anhydrous ethyl alcohol, the reaction mixture was stirred another 30 minutes.

The photosensitive film was cast directly from the reaction mixture, a polyurea block copolymer solution. Optionally, the reaction mixture was added drop by drop into 800 cc of distilled water with vigorous stirring. After filtration, washing with an excess of distilled water, and subsequent drying in vacuo, about 2,5 grams

TABLE 2

Thermoplastic Polyesters $$-O-PTMG-O-\overset{O}{\underset{\|}{C}}-R-\overset{O}{\underset{\|}{C}}-\left[-OCH_2C\equiv C-C\equiv C-CH_2O\overset{O}{\underset{\|}{C}}R\overset{O}{\underset{\|}{C}}-\right]_y$$

| Polymer | R | m.w. of PTMG | y calc | hard/soft[k] | Solvent | Properties |
|---|---|---|---|---|---|---|
| TPE-TERE-50-2000 |  | 2000 | 10.71 | 5/5 | THF | tough[f], 1–2 |
| TPE-TERE-2-2000 |  | 2000 | 3.22 | 2/8 | THF | tacky[g], 0–1 |
| TPE-TERE-10-2000 | 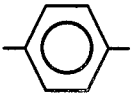 | 2000 | 1.99 | 1/9 | THF | tacky[g], 0–1 |
| TPE-CO-10-2000[b] | 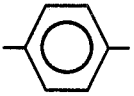 | 2000 | — | 5/5 | THF | tacky[g], 0 |
| TPE-TERE-10-1000 | 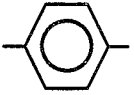 | 1000 | 1.52 | 1/9 | THF | tacky[g], 0–1 |
| TPE-TERE-10-650 |  | 650 | 1.36 | 1/9 | THF | tacky[g], 0–1 |
| TPE-AD-20-2000 | —(CH₂)₄— | 2000 | 3.40 | 2/8 | THF | tacky[g], 1–2 |

[b] a second chain extender, propylene glycol, was introduced into the polymer.
mole ratio:

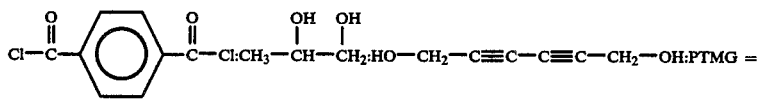

5.0:3.74:0.80:0.46
[f] = slightly translucent
[g] = transparent
[k] = wt/wt

EXAMPLE 3

Polyether-Polyurea Block Copolymer

Two grams of a PTMG (m.w.=2,000) were dissolved in about 100 cc of THF. After that 0.404 grams of HDI and 0.027 grams dibutyltin dilaurate were added and the reaction mixture was kept for an hour at room of a yellowish polymer were obtained (Yield=about 92%). The polymer was re-dissolved in dioxane and then the solution diluted with THF. A photosensitive film was obtained by casting the above solution onto a glass plate.

With a low pressure mercury lamp the exposure time was from 1 to 5 minutes. The exposed areas became insoluble in the standard developer while the unexposed area were easily washed away with this solvent. (p-TUPurea-HDI-20 in Table 3).

The second polymer in Table 3 was prepared and tested in a similar manner.

hours. After adding 2 cc of anhydrous ethyl alcohol the reaction mixture was stirred for a further 30 minutes.

The reaction mixture was added drop by drop with vigorous stirring into about 600 cc of hexane. After filtration, the precipitate was washed extensively with distilled water. It was then dried in vacuo. About 2.2 grams of a yellowish polymer were obtained (Yield: 84%). (p-TPAmide-Su-20 in Table 4). The polymer was re-dissolved in dioxane and then diluted with THF, and a photosensitive film was obtained by casting the above solution onto a glass plate.

With a low pressure mercury lamp the exposure time was from 1 to 5 minutes. The exposed areas became insoluble in the standard developer, while the unexposed areas were easily washed away with the same solvent.

The remaining two polymers in Table 4 were prepared and tested in a similar manner.

TABLE 3

Thermoplastic Polyurea

$$-O-PTMG-O-\overset{O}{\underset{\|}{C}}-NH-R-NH-\overset{O}{\underset{\|}{C}}\left[(NH-R^1-C\equiv C-C\equiv C-R^1-NH-\overset{O}{\underset{\|}{C}}-NH-R-NH-\overset{O}{\underset{\|}{C}}\right]_y$$

| Polymer | R | R$^1$ | m.w. of PTMG | y calc | hard/soft$^k$ | Solvent | Properties |
|---|---|---|---|---|---|---|---|
| p-TPUrea-HDI-20 | (CH$_2$)$_6$ | 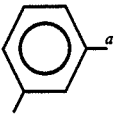$^a$ | 2000 | 2.35 | 2/8 | THF/dioxane | tough$^{f,h}$, 0–2 |
| m-TPUrea-HDI-20 | (CH$_2$)$_6$ | $^a$ | 2000 | 2.35 | 2/8 | THF/dioxane | tough$^{f,h}$, 0–1 |

$^a$preferred from nitrocinnamic acid by a 5-step synthesis
$^k$wt/wt

EXAMPLE 4

Polyether-Polyamide Block Copolymer

Two grams of a PTMG (m.w.=2,000) were dissolved in about 50 cc of alcohol-free chloroform. 0.4343 grams of succinyl chloride were added into the PTMG solution. After standing 2 hours at room temperature the above reaction mixture was added in the dark drop by drop over a period of 30 minutes to a solution containing about 100 cc of alcohol-free chloroform, 0.57 grams of triethylamine and 0.385 grams of 4,4'bisaminophenyl butadiyne. The reaction was allowed to continue at room temperature for 5 more

TABLE 4

Thermoplastic Polyamide $$-O-PTMG-O-\overset{O}{\underset{\|}{C}}-R-\overset{O}{\underset{\|}{C}}\left[NH-R'-C\equiv C-C\equiv C-R'NH-\overset{O}{\underset{\|}{C}}-R-\overset{O}{\underset{\|}{C}}\right]_y$$

| Polymer | R | R' | m.w. of PTMG | y calc | hard/soft$^k$ | Solvent | Properties |
|---|---|---|---|---|---|---|---|
| p-TPAmide-Su-20 | —CH$_2$CH$_2$— | 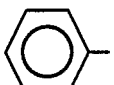 | 2000 | 2.66 | 2/8 | THF/dioxane | tough$^f$, 1–2 |
| m-TPAmide-Su-20 | —CH$_2$CH$_2$— | 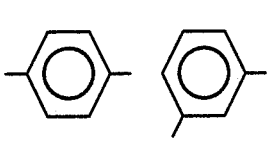 | 2000 | 2.66 | 2/8 | THF/dioxane | tough$^f$, 1–2 |
| m-TPAmide-TERE-20 | | | 2000 | 2.47 | 2/8 | THF/DMF | tough$^f$, 0–1 |

The linear block copolymers of the present invention comprise at least two types of segments, A and B. Segment A is a rigid and radiation sensitive segment comprising a prepolymer containing diacetylene units. Segment B is a soft rubbery prepolymer segment. The weight ratio of segment A to segment B is between 2:98 and 90:10. Segment A is preferably formed by the polymerizaiton of a free-hydrogen-containing compound or oligomer with a compound containing diacetylene units. The compound with the diacetylene units must react or combine with the free-hydrogen-containing compound without reaction of the diacetylene group. This is well documented in the above examples.

What we claim is:

1. A radiation sensitive linear block copolymer suitable for providing a solvent-insoluble product, said linear block copolymer comprising at least two types of segments, A and B, wherein segment A is a rigid and radiation sensitive segment comprising a prepolymer containing diacetylene groups, segment A being one selected from the group consisting of

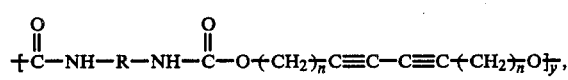

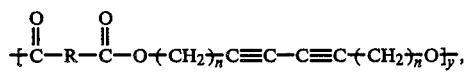

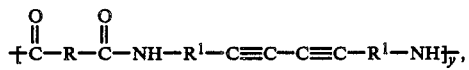

and

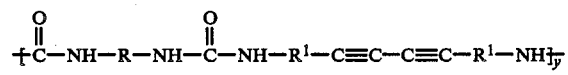

and wherein segment B is a soft rubbery segment comprising a prepolymer, segment B being one selected from the group consisting of

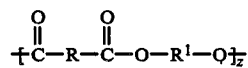

and

wherein
R, $R^1$ are the same or different and are selected from the group consisting of aliphatic, cycloaliphatic, and aromatic divalent groups of from 2 to 20 carbon atoms,
$R^2$ is H, or lower alkyl ($C_1$-$C_6$),
$R^3$, $R^4$ are lower alkyl ($C_1$-$C_4$),
n is an integer in the range of 1 to 10,
y is an integer in the range of 1 to 50, and
z is an integer in the range 2 to 100,
and wherein segments A and B are in a weight ratio of segment A to segment B of from 2:98 to 90:10.

2. A radiation sensitive linear block copolymer suitable for providing a solvent-insoluble product, said linear block copolymer comprising at least two types of segments A and B, wherein
segment A is a rigid and radiation sensitive segment comprising a prepolymer containing diacetylene groups, segment A being one selected from the group consisting of

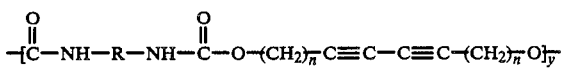

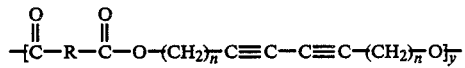

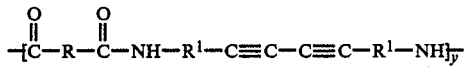

and

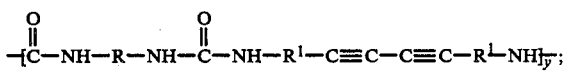

and wherein segment B is a soft rubbery segment comprising a prepolymer, segment B being one selected from the group consisting of

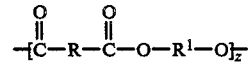

and

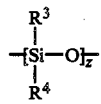

wherein R is $-(CH_2)_2-$, $-(CH_2)_4-$, $-(CH_2)_6-$,

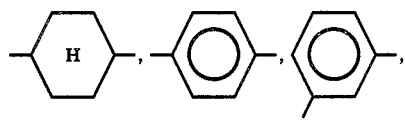

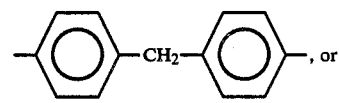

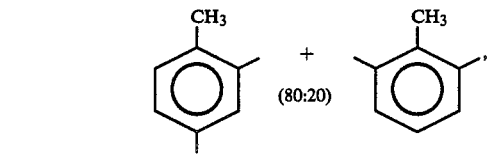

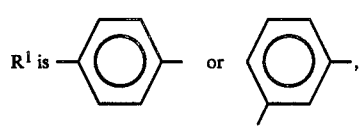

$R^2$ is H, or lower alkyl ($C_1$-$C_6$),
$R^3$, $R^4$ are lower alkyl ($C_1$-$C_4$), n is an integer in the range of 1 to 10,
y is an integer in the range 1 to 50, and
z is an integer in the range 2 to 100,
and wherein segments A and B are in a weight ratio of segment A to segment B of from 2:98 to 90:10.

3. A linear block copolymer according to claim 2 further comprised by segments A and B forming a pattern of repeating units, wherein the repeating units are one selected from the group consisting of $(AB)_x$, (BAB) and (ABA) and wherein x is an integer in the range of from 1 to 100.

4. A linear block copolymer according to claim 2 wherein the weight ratio of segment A to segment B is preferably from 10:90 to 60:40.

5. A linear block copolymer according to claim 2 further comprised by segment B having a molecular weight in a range from 300 to 10,000.

6. The linear block copolymer according to claim 5 wherein the molecular weight of segment B is preferably from 500 to 3,000.

7. A linear block copolymer according to claim 2 wherein segment A is a polyurethane which is the reaction product of 2,4-hexadiyne-1,6-diol and hexamethylene diisocyanate, segment A being 20 weight percent of the total weight of the linear block copolymer, and wherein segment B is poly(oxytetramethylene)glycol having a molecular weight of 2,000.

8. A linear block copolymer according to claim 2, wherein segment A is a polyester which is the reaction product of 2,4-hexadiyne-1,6-diol and terephthaloyl chloride, segment A being 50 weight percent of the total weight of the linear block copolymer, and wherein segment B is poly(oxytetramethyene)glycol having a molecular weight of 2,000.

9. A linear block copolymer according to claim 2 wherein segment A is a polyurea which is the reaction product of 4,4'-bisaminophenyl butadiyne and hexamethylene diisocyanae, segment A being 20 weight percent of the total weight of the linear block copolymer, and wherein segment B is poly(oxytetramethylene)glycol having a molecular weight of 2,000.

10. A linear block copolymer according to claim 2 wherein segment A is a polyamide which is the reaction product of 4,4'-bisaminophenyl butadiyne and succinyl chloride, segment A being 20 weight percent of the total weight of the linear block copolymer, and wherein segment B is poly(oxytetramethylene)glycol having a molecular weight of 2,000.

* * * * *